(12) United States Patent
Masson

(10) Patent No.: US 7,579,884 B2
(45) Date of Patent: Aug. 25, 2009

(54) FREQUENCY DOUBLER DEVICE

(75) Inventor: Gilles Masson, Voreppe (FR)

(73) Assignee: Commissariat a l'Energie Atomique, Paris (FR)

( * ) Notice: Subject to any disclaimer, the term of this patent is extended or adjusted under 35 U.S.C. 154(b) by 150 days.

(21) Appl. No.: 11/721,902

(22) PCT Filed: Dec. 8, 2005

(86) PCT No.: PCT/FR2005/003081

§ 371 (c)(1),
(2), (4) Date: Sep. 24, 2007

(87) PCT Pub. No.: WO2006/064110

PCT Pub. Date: Jun. 22, 2006

(65) Prior Publication Data

US 2008/0246473 A1 Oct. 9, 2008

(30) Foreign Application Priority Data

Dec. 15, 2004 (FR) .................................. 04 13352

(51) Int. Cl.
*H03B 19/00* (2006.01)
(52) U.S. Cl. ..................... 327/122; 327/119; 327/116
(58) Field of Classification Search ............... 327/116, 327/119–122, 113, 114, 172, 175, 176
See application file for complete search history.

(56) References Cited

U.S. PATENT DOCUMENTS 4,596,954 A * 6/1986 Haque ..................... 327/116
4,799,022 A * 1/1989 Skierszkan ............... 327/116
5,111,066 A * 5/1992 Artieri et al. ............. 327/116
5,257,301 A 10/1993 Vanderbilt
5,635,866 A * 6/1997 Monk et al. .............. 327/116
6,337,588 B1 * 1/2002 Chen ....................... 327/122
7,010,287 B2 * 3/2006 Oh et al. .................. 455/318

FOREIGN PATENT DOCUMENTS

EP 0 155 041 A 9/1985
EP 0 977 362 A 2/2000

OTHER PUBLICATIONS

PCT/IB306 Form—Commissariat A. L'Energie Atomique—in French, Jun. 1, 2007.
PCT International Preliminary Examination Report in French, Oct. 13, 2006.
Nagaraj K et al., "A Frequency Doubler For Rectangular Inputs", International Journal of Electronics, pp. 433-436, Mar. 1984, XP002084165.
PCT International Preliminary Report on Patentability, English translation Oct. 13, 2006.

* cited by examiner

*Primary Examiner*—Lincoln Donovan
*Assistant Examiner*—Hai L Nguyen
(74) *Attorney, Agent, or Firm*—Brinks Hofer Gilson & Lione

(57) ABSTRACT

A frequency doubler circuit includes first and second arrangements of switches connected to the positive and negative inputs of a comparator, respectively, and arranged in such a way that first and third voltages during the first phase of a reference clock signal and second and fourth voltages during a second phase opposite to the first phase are applied to the positive and negative inputs, where the first and second voltages and the third and fourth voltages are shifted with respect to each other at a half-period of the reference clock signal and the ratio between slopes of the voltages is fixed with respect to a selected current.

11 Claims, 4 Drawing Sheets

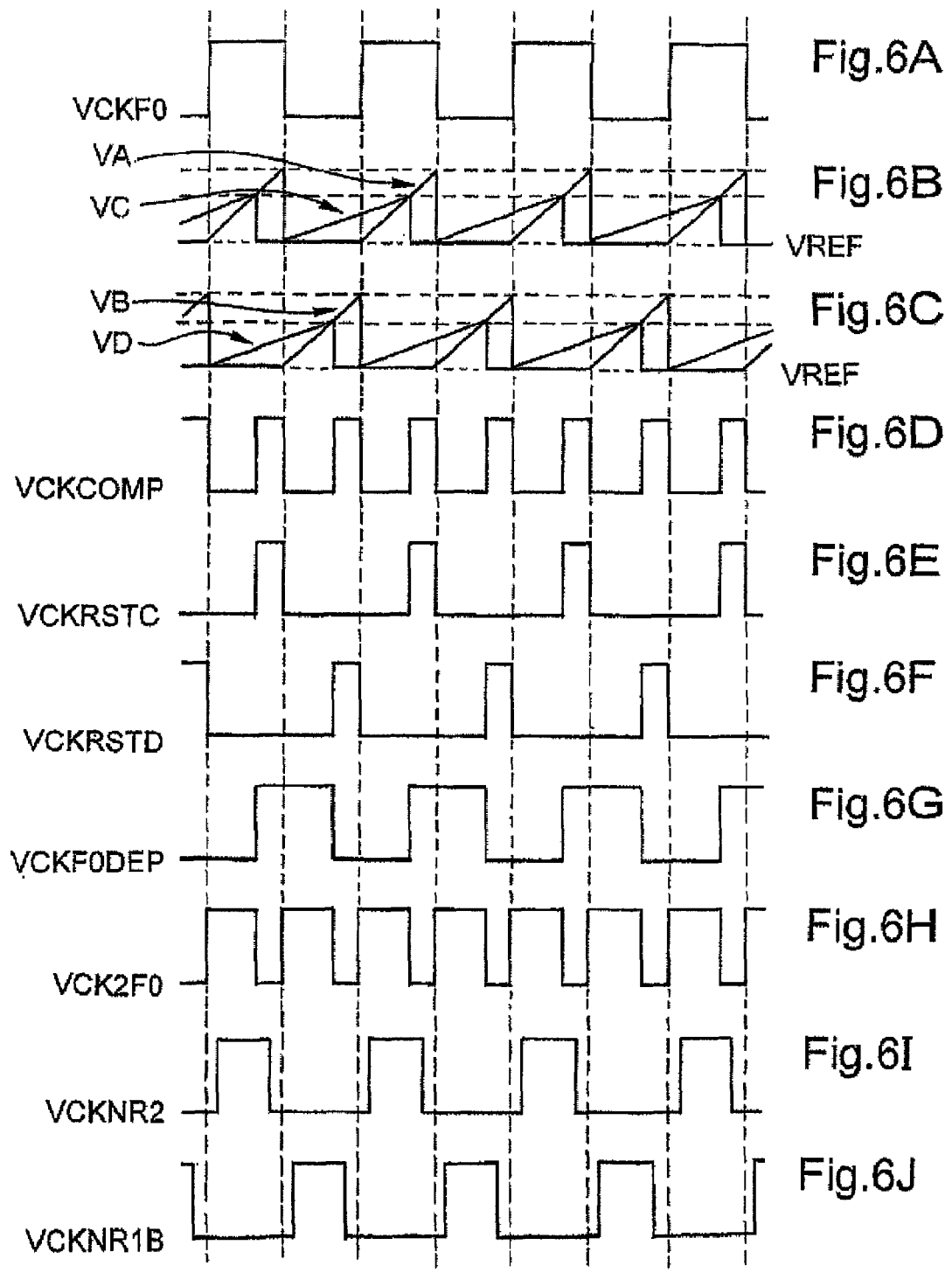

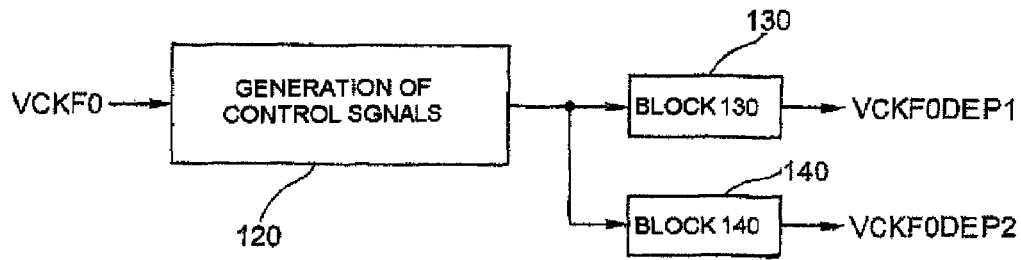
Fig. 7A
Fig. 7B
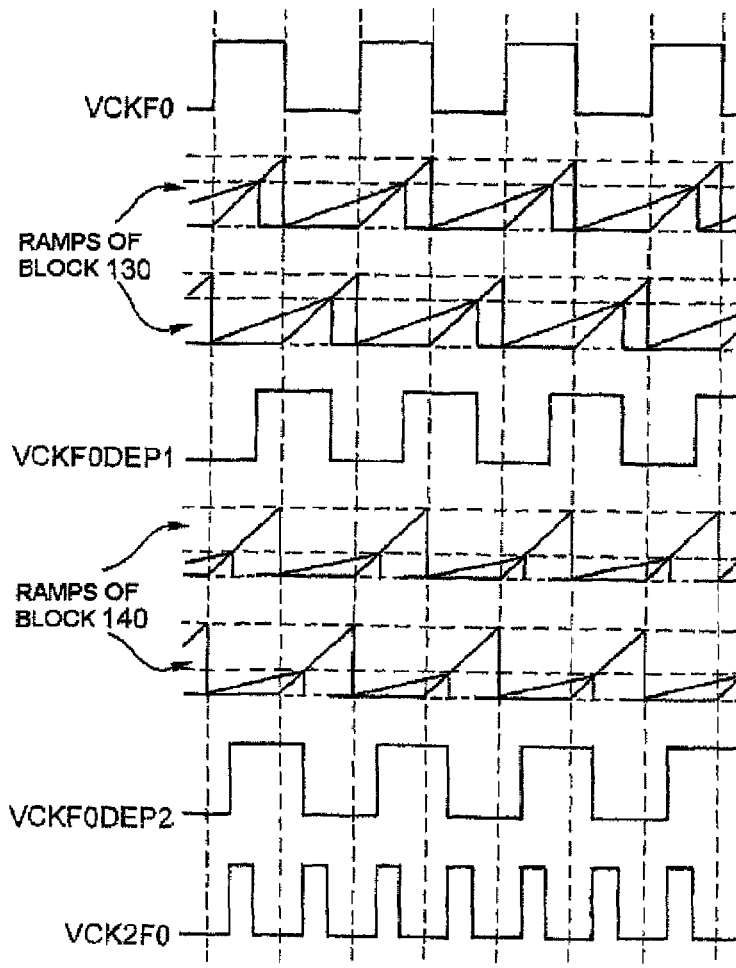

FREQUENCY DOUBLER DEVICE

PRIORITY CLAIM

This application is U.S. nationalization of PCT Application No. PCT/FR2005/003081, filed Dec. 8, 2005, and claims priority to French patent application No. 0413352, filed Dec. 15, 2004.

TECHNICAL FIELD

The present invention relates to electronic circuits having to produce a clock having a frequency twice that of the input clock, commonly called "frequency doubler". It more particularly relates to the frequency doubler circuits whose duty cycle is continuously adjustable in the range for example from 15% to 85%.

BACKGROUND

Already known is the phase-locked loop technique for producing a clock having a frequency twice that of the input clock.

In this technique, the frequency doubler circuit typically comprises a phase-locked loop, of PLL structure, or of DLL (Delay-Locked Loop) structure. Such structures are made up of the same blocks but arranged differently. These blocks comprise a voltage-controlled delay line (looped in a PLL structure to form a voltage-controlled oscillator), a phase comparator, a frequency divider and a low-pass filter.

Such a frequency doubler circuit is complex to design, particularly because of the stability problems for a PLL structure, occupies a large area and can produce a significant random phase offset, or jitter.

Also, the adjustment resolution of the duty cycle is not continuous, and is directly linked to the number of cells forming the delay line, said number having to increase to increase the resolution of the adjustment.

Also known is the so-called "dual-ramp or phase-shift" technique, for producing a clock having a frequency twice that of the input clock. Such a known technique generally uses an exclusive OR gate XOR receiving as input two clocks of the same frequency, offset relative to each other and delivering as output a double-frequency clock with a duty cycle dependent on the phase offset between the two input clocks.

The phase offset is typically produced using a voltage comparator which compares a ramp of voltages generated in synchronism with one of the input clocks with a reference voltage. The switchover points correspond to the edges of the offset clock.

Such a technique uses two voltage ramps, a positive one generated on the half-period of the input clock and the other negative one generated on the next half-period. Two switchovers are thus obtained using a comparator.

In such a dual-ramp system, it is difficult to perfectly control the phase offset between the two clocks, the latter depending on the difference in slope between the positive and negative ramps. It is also necessary to know the amplitude and the mean of the "triangle" of voltages generated in order to adjust the reference level for the comparison. This adds complexity, increases the surface area of the circuit and reduces the precision of the duty cycle.

U.S. Pat. No. 5,257,301 describes a frequency doubler relying on the dual-ramp technique. However, the frequency doubler in this case comprises a large number of comparators for varying the duty cycle inasmuch as one comparator is needed for each duty cycle value.

Also known is a technique based on an automatic loop system for compensating the problems of matching between the ramps. European Patent No. 0155041 describes this technique in which the double frequency clock is "averaged" in order to extract a voltage proportional to the duty cycle and reintroduce it as input to the system on the switchover threshold of the comparator. In European Patent No. 0155041, instead of a voltage ramp generation, there is a direct generation of a double-frequency clock by using an exclusive OR gate and a delay cell. The double-frequency clock obtained from the exclusive OR gate has a duty cycle dependent on the delay between the two input signals of the exclusive OR gate. This double-frequency clock is, after integration, compared to a voltage reference proportional to the duty cycle at the output of the system. Such a technique is not very compact because, on the one hand, the delay cell has to generate a significant delay and comprises in particular high-value capacitors and, on the other hand, the integrator consists of a capacitor and a resistor, both of high values.

SUMMARY

The present invention provides a solution to just such problems.

Thus, it aims, based on a single input frequency clock of chosen duty cycle, to generate a synchronous clock of twice the frequency and of a duty cycle that is continuously adjustable and precise, particularly insensitive to technological variations, and using an electronic circuit occupying a small area.

More specifically, it relates to a frequency doubler device comprising an exclusive OR gate having a first input receiving a first clock signal of reference frequency, a second input receiving a second clock signal of the same frequency as the first clock signal and offset relative to said first clock signal by a chosen offset, and an output delivering a clock signal of twice the frequency of the reference frequency and with a duty cycle dependent on said offset.

According to a general definition of the invention, the device also comprises:

a comparator having a positive input, a negative input and an output linked to the second input of the exclusive OR gate, through a flip-flop; and first and second arrangements of switches respectively linked to the positive and negative inputs of the comparator, and arranged to apply respectively to said positive and negative inputs, first and third voltages during a first phase of the reference clock signal and second and fourth voltages during a second phase that is the reverse of the first phase, said first and second voltages on the one hand and the third and fourth voltages on the other hand being offset relative to each other by a half-period of the reference clock signal, the ratio of the slopes of said voltages being fixed by a chosen current ratio.

According to one embodiment, the first and third voltages are generated from a capacitor, of which one of the terminals is linked to a power supply terminal through a current source of chosen current ratio and the other of the terminals is linked to another power supply terminal, the terminals of the capacitor being linked to each other through a switch, the opening/closing of which is controlled by a signal in opposition to the reference clock signal and another switch controlled by a signal in phase with the reference clock signal.

According to another embodiment, the third and fourth voltages are generated from a capacitor, of which one of the terminals is linked to a power supply terminal through a current source of chosen current ratio, and the other of the terminals is linked to another power supply terminal, the terminals of the capacitor being linked to each other through a switch, the opening/closing of which is controlled by a signal synchronous with the signal from the comparator.

The frequency doubler device according to the invention eliminates the drawbacks of the prior structures inasmuch as the voltages are generated from the same components and are in the same direction, which reduces the problem of mismatching, and only one comparator is used, which further reduces the mismatch and the corresponding area. Moreover, the duty cycle is fixed by a current ratio, which generates a good precision on the duty cycle.

Another subject of the present invention is a device comprising an exclusive OR gate having a first input receiving a first signal delivered by a first frequency doubler device according to the invention, a second input receiving a second signal delivered by a second frequency doubler device according to the invention, and an output delivering a signal of frequency twice that of the first or second signal.

BRIEF DESCRIPTION OF THE DRAWING

Other characteristics and advantages of the invention will become apparent in light of the detailed description that follows and the drawings in which:

FIGS. 6A to 6J represent timing diagrams relating to the voltages and clock signals of FIGS. 4 and 5A to 5D according to the invention;

FIGS. 7A and 7B diagrammatically represent one embodiment generating two phase-shifted clocks and an exclusive OR gate receiving said phase-shifted clocks; and FIGS. 8A to 8H represent timing diagrams relating to the voltages and clock signals of the devices of FIGS. 7A and 7B.

DETAILED DESCRIPTION

Figure 1:
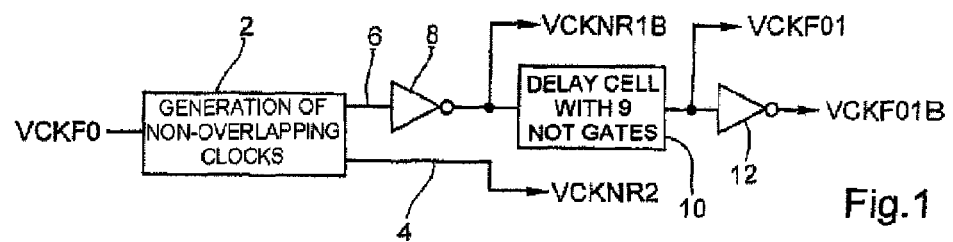
FIG. 1 diagrammatically represents the generation of several control signals intended to drive the arrangements of switches based on a reference clock signal according to the invention.

With reference to FIG. 1, the reference clock signal is designated by the reference VCKF0. It is this reference clock that is to be doubled in frequency, with a variable duty cycle.

From this frequency VCKF0, a block 2 will generate several control signals or clocks VCKNR1B, VCKNR2, VCKF01 and VCKF01B, which will be detailed further below.

In practice, the block 2 comprises a block generating non-overlapping clocks having a first output 4 delivering the clock VCKNR2 and a second output 6 delivering the clock VCKNR1B via a NOT gate 8. The clock VCKNR1B is applied to a delay cell with nine NOT gates 10 to deliver the clock VCKF01 and the clock VCKF01B via a NOT gate 12.

Non-overlapping clocks are clocks with switching edges offset relative to each other by a chosen offset, as will be described in detail with reference to the timing diagrams in FIGS. 6A to 6J.

Figure 2:
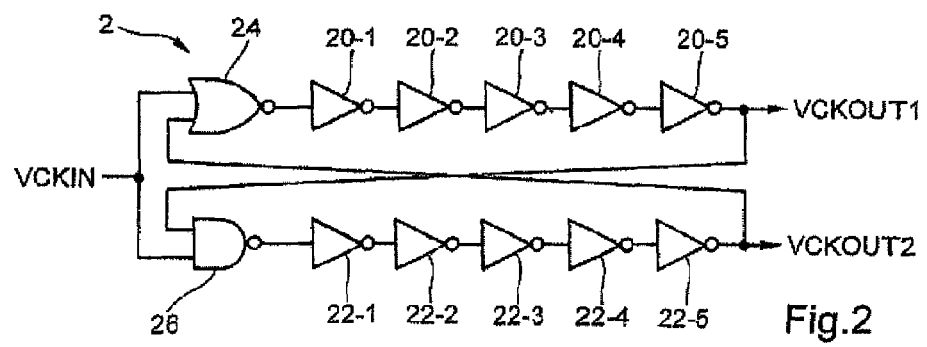
FIG. 2 diagrammatically represents a block for generating non-overlapping clocks according to the invention.

With reference to FIG. 2, the block 2 for generating non-overlapping clocks comprises two chains of NOT gates 20 and 22, each separated into 20-1, 20-2, 20-3, 20-4, 20-5 and 22-1, 22-2, 22-3, 22-4, 22-5.

The chain of NOT gates 20, preceded by a gate 24 having the clock VCKIN for its input, delivers a clock VCKOUT1. The chain of NOT gates 22, preceded by a NAND gate 26, having the clock VCKIN for its input, delivers a clock VCKOUT2. The output of the chain 22 is linked to the other input of the NOR gate 24 and the output of the chain 20 is linked to the other input of the NAND gate 26.

Figure 3:
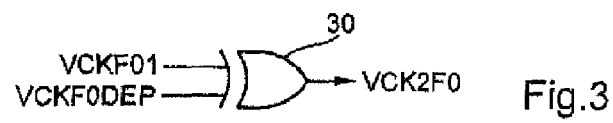
FIG. 3 diagrammatically represents the exclusive OR gate for generating the double-frequency clock according to the invention.

FIG. 3 shows an exclusive OR gate 30. From the input clock VCKF01 (in phase with VCKF0) and a phase-shifted clock VCKF0DEP that will be described in more detail with reference to FIG. 4, the gate 30 generates the double-frequency clock VCK2F0 with a determined duty cycle.

Figure 4:
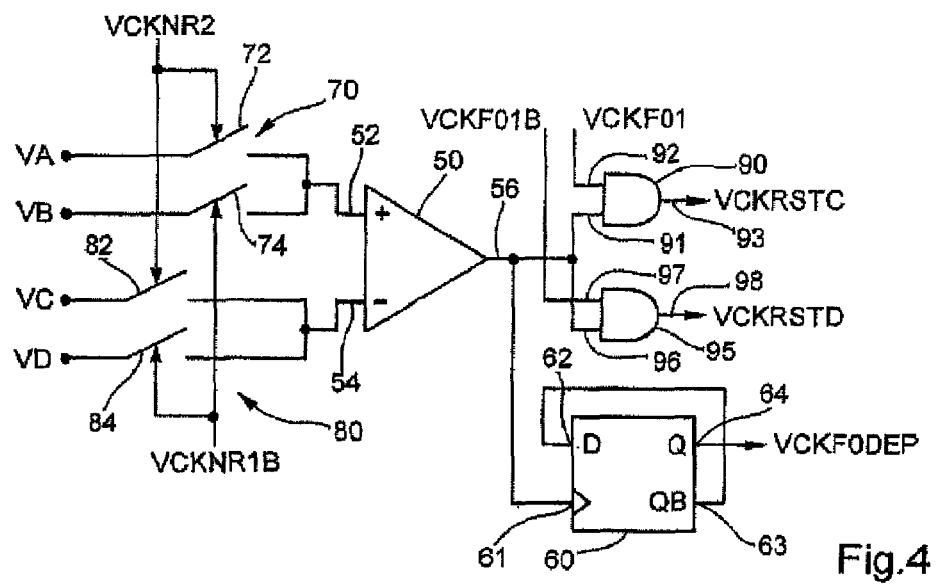
FIG. 4 diagrammatically represents one embodiment of the arrangements of switches according to the invention.

With reference to FIG. 4, the frequency doubler device according to the invention includes a comparator 50 having a positive input 52, a negative input 54 and an output 56 linked to an input of the exclusive OR gate 30 of FIG. 3 via a D flip-flop 60.

The device also comprises first and second arrangements of switches 70 and 80 respectively linked to the positive 52 and negative 54 inputs of the comparator 50.

The arrangement of switches 70 comprises two switches 72 and 74.

The arrangement of switches 80 comprises two switches 82 and 84.

The arrangements of switches 70 and 80 are arranged to respectively apply to said positive 52 and negative 54 inputs of the comparator 50, first VA and third VC voltages during a first phase VCKNR2 of the reference clock signal and second VB and fourth VD voltages during a second phase VCKNR1B that is the reverse of the first phase VCKNR2.

The voltages VA and VB are roughly identical, but offset relative to each other by a half-period of the reference clock signal. Similarly, the voltages VC and VD are roughly identical, but offset relative to each other by a half-period of the reference clock signal. The slopes of the voltages VA and VC are offset relative to each other by a chosen current ratio k. Similarly, the voltages VB and VD are offset relative to each other by said current ratio k.

Thus, on a positive half-wave of the reference clock VCKF0, the voltages VA and VC are compared using the comparator 50, because the signal VCKNR2 closes the switches 72 and 82 of the arrangements 70 and 80 and the signal VCKNR1B opens the switches 74 and 84 of the arrangements 70 and 80.

On a negative half-wave of the reference clock VCKF0, the voltages VB and VD are compared using the same comparator 50, because the signal VCKNR1B closes the switches 74 and 84 and the signal VCKNR2 opens the switches 72 and 82.

The signal VCKCOMP from the output 56 of the comparator 50 switches over on the positive and negative half-waves of the clock VCKF0, which will make it possible to generate the phase-shifted clock VCKF0DEP using a D flip-flop 60.

The D flip-flop 60 comprises an input 61 linked to the output 56 of the comparator. The D input 62 of the flip-flop 60 is linked to the QB terminal 63 of the flip-flop 60. The Q output 64 of the flip-flop delivers the signal VCKF0DEP.

When the comparator 50 has switched over, the voltages VC or VD should be reset to zero before another voltage is generated, because said voltages are generated at the start of the next half-wave.

This is done using the clocks VCKRSTC and VCKRSTD. In practice, the clock VCKRSTC is delivered by the output 93 of a NAND gate 90, one 91 of the inputs of which is linked to the output 56 of the comparator and the other input 92 of which receives the signal VCKF01. For its part, the clock VCKRSTD is delivered by the output 98 of a NAND gate 95, one 96 of the inputs of which is linked to the output 56 of the comparator and the other input 97 of which receives the signal VCKF01B.

For the voltages VA and VB, there is no reset-to-zero problem, because they last only half a half-wave.

As can be seen in FIGS. 5A to 5D, the capacitors CA, CB, CC and CD respectively generate the ramps or voltages VA, VB, VC and VD.

Figures 5A, 5B, 5C, 5D:
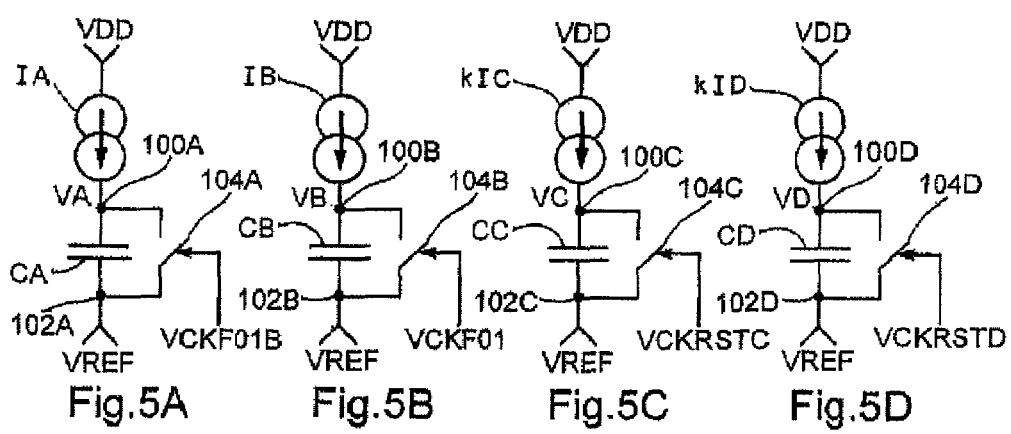
FIGS. 5A to 5D diagrammatically represent the generation of the voltages applied to the positive and negative inputs of the comparator according to the invention.

For example, with reference to FIG. 5A, the voltage VA is generated by an arrangement consisting of a capacitor CA, one terminal 100A of which is linked to a power supply terminal VDD via a current source IA and another terminal 102A of which is linked to another, reference, power supply terminal VREF. The terminals 100A and 102A of the capacitor CA are linked to each other via a switch 104A, the opening/closing of which is controlled by the signal VCKF01B, in opposition to the reference signal.

The power supply terminal VDD is, for example, 3.3 V. For its part, the power supply terminal VREF is, for example, 1 V.

For its part, referring to FIG. 5B, the voltage VB is generated by an arrangement consisting of a capacitor CB, one terminal 100B of which is linked to a power supply terminal VDD via a current source IB and another terminal 102B of which is linked to another, reference, power supply terminal VREF. The terminals 100B and 102B of the capacitor CB are linked to each other via a switch 104B, the opening/closing of which is controlled by the signal VCKF01, in phase with the reference clock signal.

Regarding the voltage VC, with reference to FIG. 5C, it is generated by an arrangement consisting of a capacitor CC, one terminal 100C of which is linked to a power supply terminal VDD via a current source kIC and another terminal 102C of which is linked to another, reference, power supply terminal VREF. The terminals 100C and 102C of the capacitor CC are linked to each other via a switch 104C, the opening/closing of which is controlled by the signal VCKRSTC, obtained from the comparator via the gate 90.

Finally, with reference to FIG. 5D, the voltage VD is generated by an arrangement consisting of a capacitor CD, one terminal 100D of which is linked to a power supply terminal VDD via a current source kID, and another terminal 102D of which is linked to another, reference, power supply terminal VREF. The terminals 100D and 102D of the capacitor CD are linked to each other via a switch 104D, the opening/closing of which is controlled by the signal VCKRSTD, obtained from the comparator via the gate 95.

When the capacitors are discharged, the voltages VA, VB, VC and VD are identical in value and are equal to VREF. Thus, VA=VB=VC=VD and IA=IB=IC=ID.

The ramps have different slope angles, which are adjusted by the coefficient k applied to the currents IC and ID. The coefficient k is, for example, less than 0.5 and makes it possible to adjust the slope of the ramps, therefore the "crossover" point of the ramps and therefore the duty cycle of the clock VCKF0DEP.

The duty cycle Dcy is given by the following formula:

$$Dcy=k/(1-k) \text{ with } k<0.5$$

For example, k=⅓=0.33 gives a duty cycle of 50%, k=3/7=0.43 gives 75% and k=⅕=0.20 gives 25%.

With reference to FIG. 6A, the reference clock signal VCKF0 is a rectangular signal, for example with a frequency f=10 MHz.

With reference to FIG. 6B, the voltages VA and VC are ramps of different slope angles, dependent on the coefficient k. On a positive half-wave of the reference clock VCKF0, the voltages VA and VC are compared to each other using the comparator 50. The result of the comparison is expressed by the signal VCKCOMP (FIG. 6D).

With reference to FIG. 6C, the voltages VB and VD are ramps of different slope angles, dependent on the coefficient k. On a negative half-wave of the reference clock VCKF0, the voltages VB and VD are compared to each other using the comparator 50. The result of the comparison is expressed by the signal VCKCOMP (FIG. 6D). The voltages VA and VB are identical, but offset relative to each other by a half-period of the reference clock signal VCKF0. Similarly, the voltages VC and VD are roughly identical, but offset relative to each other by a half-period of the reference clock signal VCKF0.

With reference to FIGS. 6E and 6F, the reset signals VCKRSTC and VCKRSTD respectively reset to zero the voltages VC and VD at the end of the respective half-wave.

With reference to FIG. 6G, the signal VCKF0DEP corresponds to the offset generated by the switching of the voltage ramps according to the invention.

With reference to FIG. 6H, the clock signal VCK2F is a rectangular signal of twice the frequency of the signal VCKF0, for example with a frequency 2f=2 MHz.

With reference to FIG. 6I, the signal VCKNR2 is here called the first phase of the clock signal. The switching edges of the signal VCKNR2 are offset relative to those of the signal VCKF0 (non-overlapping clocks), by an offset that is dependent on the number of NOT gates 20 (FIG. 2).

With reference to FIG. 6J, the signal VCKNR1B is here called the second phase of the reference clock signal, the reverse of the first phase.

The two clocks VCKNR2 and VCKNR1B are of the same frequency and non-overlapping, that is, their periods of activity do not overlap and, also, have areas either side of the activity in which the two clocks are both inactive (non-overlap areas). With reference to FIGS. 6I and 6J, the periods of activity are the high levels of the clocks and the periods of inactivity are the low levels of the clocks. It can clearly be seen on the one hand that when VCKNR2 is active, VCKNR1B is not, and vice-versa, and, on the other hand, that there are indeed areas in which the two clocks are inactive (non-overlap areas).

The frequency doubler device according to the invention is much more compact compared to the PLL or DLL techniques of the prior art. It is, in particular, more robust in a noise-affected medium because there is no voltage-controlled oscillator (VCO). Furthermore, the duty cycle can be adjusted continuously from 15 to 85%.

The precision on the duty cycle is better than the conventional ramp techniques, because there is no need to generate two matched currents in opposite directions, which cancels out some of the mismatch problems and the problems of imbalance in the rejections of the power supplies.

Furthermore, the frequency doubler device according to the invention is more compact, because there is no need to recover the amplitude and the average of the signal synchronized on the input clock, which cancels out the system's problems of offset and set-up time.

Compared to the technique disclosed in patent EP-A-0155041, the response time to changes of frequency is faster because the inventive system is not looped.

The problem of mismatch, which adds imprecision to the system, is here far less significant because the technique according to the invention uses only one active element (comparator) which is used for both half-waves, compared to two for the patent EP-A-0155041.

Moreover, compared to the patent EP-A-0155041, the device according to the invention does not require a delay cell generating a significant delay or an integrator comprising capacitor and resistor.

Moreover, the duty cycle here depends only on a current ratio of the same direction whereas it depends on a voltage difference in the European Patent No. EP-A-0155041, which adversely affects the precision.

The adjustment range of the duty cycle is therefore greater in the inventive device and requires no precise voltage reference generation.

The present invention can be used in the synchronous detection technique in a "microfluxgate" type circuit corresponding to a magnetic field measuring circuit comprising a flux gate magnetic sensor produced by a microelectronic technology and a sensor excitation and information reading electronic circuit. A microfluxgate-type sensor is excited by a triangular analog signal of frequency F0 generated by a local oscillator. The amplitude of the harmonic signal 2, which contains the useful information, is measured using a synchronous detection system which consists in multiplying the input analog signal by a clock of frequency 2F0.

The local oscillator directly generates both the triangular analog excitation signal and the clock of frequency F0. A frequency doubler is therefore needed to generate the clock of frequency 2F0 from the clock of frequency F0. Moreover, to optimize the effectiveness of the synchronous detection, the phase of the signal of frequency 2F0 must be adjusted, either manually by measurement feedback, or with an automatic loop which is able to detect the optimum phase and controls the system generating the clock 2F0.

In this context, the invention is perfectly suitable since the phase adjustment can be done simply and continuously by adjusting the currents of the generated ramps. Two structures of the type of that described with reference to FIGS. 1 to 6 are then used.

With reference to FIGS. 7A and 7B, two clocks VCKF0DEP1 and VCKF0DEP2 are generated separately from two blocks 130 and 140 produced in a way similar to that of the frequency doubler described with reference to FIGS. 1 to 6.

A block 120 for generating control signals, receives the reference signal VCKF0. The block 120 is common to both blocks 130 and 140. An exclusive OR gate 150 delivers a double-frequency clock VCK2F0 from the two clocks of frequencies F0, VCKF0DEP1 and VCKF0DEP2 applied to the inputs of the exclusive OR gate 150.

The relative values of the currents for each of the blocks 120 and 130 make it possible on the one hand to control the phase shift between the clock VCK2F0 and VCKF0 and, on the other hand, to control the duty cycle of the clock VCK2F0.

FIGS. 8A to 8H are the timing diagrams of the reference clock signal VCKF0 (FIG. 8A), phase-shift signal for the block 130 VCKF0DEP1 (FIG. 8D), phase-shift signal for the block 140 VCKF0DEP2 (FIG. 8G) and double frequency signal VCK2F0 (FIG. 8H).

The voltage ramps of the block 130 (FIGS. 8B and 8C) are similar to those of the voltages VA, VB, VC and VD described with reference to FIGS. 6B and 6C.

Similarly, the voltage ramps of the block 140 (FIGS. 8E and 8F) are similar to those of the voltages VA, VB, VC and VD described with reference to FIGS. 6B and 6C.

The invention claimed is:

1. A frequency doubler device configured to receive an input signal at a reference frequency and to deliver an output clock signal having a frequency twice that of the reference frequency and having a chosen duty cycle, the frequency doubler device comprising an exclusive OR gate having a first input receiving a first clock signal at the reference frequency, a second input receiving a second clock signal at the same frequency as the first clock signal and offset relative to said first clock signal by a chosen offset determining the duty cycle, and an output delivering the output clock signal with a frequency twice the reference frequency;

wherein the device further comprises a first block comprising:
a D flip-flop having a D input, an output linked to the second input of the exclusive OR gate to apply the second clock signal to the input, and an inverse output linked to the D input,
a comparator having a positive input, a negative input and an output controlling the D flip-flop,
first and second arrangements of switches respectively linked to the positive and negative inputs of the comparator, and controlled by a first control signal substantially in phase with the input signal and a second control signal at least partially the reverse of the first control signal to apply respectively, to said positive and negative inputs, either first and third voltages, or second and fourth voltages, wherein the first, second, third and fourth voltages are voltage ramps,
four voltage ramp generation devices for the first, second, third and fourth voltages, each voltage ramp generation device comprising a current source in series with a capacitor between a power supply voltage and a reference voltage and a reset switch in parallel with the capacitor, the current sources of the third and fourth voltage ramp generation devices presenting a current ratio k relative to the current sources of the first and second voltage ramp generation devices, wherein the opening of the reset switches of the first and fourth voltage ramp generation devices and the opening of the reset switches of the second and third voltage ramp generation devices being controlled by third and fourth control signals substantially the reverse of each other and in phase or in phase opposition with the first and second control signals, wherein the first and second voltages relative to the third and fourth voltages are offset by a half-period of the input signal, and wherein the ratio of the slopes of the first and second voltage ramps relative to the slopes of the third and fourth voltage ramps are determined by the chosen current ratio (k), where the current ratio is chosen according to the chosen duty cycle.

2. The device according to claim 1, wherein the first clock signal applied to the exclusive OR gate and the fourth control signal comprise the same signal.

3. The device according to claim 1, further comprising a second block, wherein the first clock signal applied to the exclusive OR gate is generated by the second block, and wherein the second block comprises a comparator, a flip-flop, arrangements of switches and voltage ramp generation devices, wherein the first and second blocks are connected to a control signal generation block receiving the input signal and delivering the first, second, third, and fourth control signals from the input signal.

4. The device according to claim 1, wherein the first and second control signals are non-overlapping clock signals.

5. The device according to claim 1 further comprising first and second chains of NOT gates preceded by a NOR gate and a NAND gate, respectively, wherein the input signal is applied to a first input of the NOR and NAND gates, respectively, wherein the output of the first chain is applied to a second input of the NAND gate and the output of the second chain is applied to a second input of the NOR gate.

6. The device according to claim 5, wherein the fourth control signal is delivered by a delay cell receiving the second control signal.

7. The device according to claim 6, wherein the third control signal is delivered by a NOT gate receiving the fourth control signal.

8. The device according to claim 1, wherein the first arrangement of switches comprises first and second switches respectively receiving the first and second voltages, and the outputs of which are connected to the positive input of the comparator, wherein the second arrangement of switches comprises third and fourth switches respectively receiving the third and fourth voltages, and the outputs of which are connected to the negative input of the comparator, and wherein the first and third switches are controlled by the first control signal and the third and fourth switches are controlled by the second control signal.

9. The device according to claim 1, wherein the reset switch of the first voltage ramp generation device is controlled by the third control signal and the reset switch of the second ramp voltage generation device is controlled by the fourth control signal.

10. The device according to claim 1, wherein the reset switches of the third and fourth voltage generation devices are controlled by signals delivered by AND gates to which are applied the output signal from the comparator and, respectively, the third and fourth control signals.

11. A magnetic field measuring circuit comprising a fluxgate magnetic sensor produced in microelectronic technology, an electronic excitation circuit of the sensor receiving an input signal, and a synchronous detection system comprising a frequency doubler device according to any one of claims 1 to 10, to which the input signal is applied.

* * * * *